United States Patent [19]

Hieber et al.

[11] Patent Number: 4,817,277

[45] Date of Patent: Apr. 4, 1989

[54] METHOD OF MANUFACTURING AN ELECTRICALLY CONDUCTIVE ADHESIVE BOND

[75] Inventors: Hartmann Hieber, Hamburg; Wolfgang Thews, Wewelsfleth, both of Fed. Rep. of Germany

[73] Assignee: U.S. Philips Corporation, New York, N.Y.

[21] Appl. No.: 15,772

[22] Filed: Feb. 17, 1987

[30] Foreign Application Priority Data

Mar. 11, 1986 [DE] Fed. Rep. of Germany ....... 3608010

[51] Int. Cl.$^4$ ............................................. H05K 3/00
[52] U.S. Cl. ..................................... 29/832; 156/291; 156/292; 156/331.1; 174/88 R; 174/94 R; 428/901
[58] Field of Search ................... 427/97, 96; 174/68.5, 174/94 R; 428/901; 29/825, 25.35, 832, 841, 842, 843, 840; 156/331.1, 315, 319, 297, 292, 153

[56] References Cited

U.S. PATENT DOCUMENTS

| | | | |
|---|---|---|---|
| 3,506,482 | 4/1970 | Hirohara et al. | 174/68.5 |
| 3,606,677 | 9/1971 | Ryan | 174/68.5 X |
| 3,984,598 | 10/1976 | Sarazin et al. | 428/901 X |
| 4,113,981 | 9/1978 | Fujita et al. | 174/88 R |
| 4,554,033 | 11/1985 | Dery et al. | 29/830 X |
| 4,581,301 | 4/1986 | Michaelson | 427/97 X |
| 4,585,502 | 4/1986 | Vozu et al. | 427/97 X |
| 4,666,547 | 5/1987 | Snowden et al. | 156/331.1 X |
| 4,667,401 | 5/1987 | Clements et al. | 29/840 X |

FOREIGN PATENT DOCUMENTS

| | | | |
|---|---|---|---|
| 697879 | 11/1964 | Canada | 428/901 |
| 966937 | 4/1975 | Canada | 29/825 |

*Primary Examiner*—Howard N. Goldberg
*Assistant Examiner*—Carl Arbes
*Attorney, Agent, or Firm*—Norman N. Spain

[57] ABSTRACT

A method of manufacturing an electrically conductive adhesive bond between electrically conductive parts whose surfaces to be bonded exhibit a certain surface roughness, the surfaces to be bonded each being provided with a layer of at least one transition element of the first and/or second transition series of the periodic system of elements, which layer has a surface roughness in the $\mu$m-range, such a quantity of an electrically non-conductive adhesive being used to form the adhesive bond that the raised portions of the transition-element-layer are still in contact with each other.

15 Claims, No Drawings

METHOD OF MANUFACTURING AN ELECTRICALLY CONDUCTIVE ADHESIVE BOND

BACKGROUND OF THE INVENTION

The invention relates to a method of manufacturing an electrically conductive adhesive bond between electrically conductive parts whose surfaces to be bonded exhibit a certain degree of surface roughness.

In microelectronics, electric connections between, for example, components and printed circuit boards or sub-carriers in the form of glass or ceramic plates are formed by microwelding, soft soldering and glueing. In contrast with the necessarily sequential microwelding process, soldering and glueing processes have the advantage that all connections at one circuit level can be formed substantially at the same time.

In microelectronics adhesive bonds are formed with electrically conductive adhesives which are filled with up to 70% by volume of metal powder, for example silver powder, to obtain reliable electric connections. The adhesive establishes the mechanical connection between the contact surfaces to be bonded; the metal particles suspended in the adhesive contact one another and thus provide electric conduction.

A disadvantage of the use of adhesives which are filled with metal powder is that they must be applied very accurately when the parts to be bonded have small dimensions, and moreover, short-circuits may develop between closely spaced terminal areas. For this reason, the microelectronics industry predominantly employs soft-soldering methods which have the additional economical advantage that the coating process, which is necessary to obtain surfaces which can be subjected to soft-soldering and which consists of the electro-deposition of tin-coated copper layers, can be carried out readily and reproducibly accurate, even when the dimensions are small, and because the price of commercially available soft solder is low. Thoroughly prepurified surfaces are a prerequisite for the use of metal-powder-filled bonding agents which, in addition, are relatively expensive (at present DM 1000/kg). Consequently, their use is limited to very high-quality and/or tmperature-sensitive parts of circuits.

SUMMARY OF THE INVENTION

It is an object of the invention to provide a method by means of which electrically conductive adhesive bonds can also be formed between parts of small dimensions without the risk of short-circuits developing between closely spaced contact areas, which method is far more economical than the known bonding method which makes use of metal-powder-filled bonding agents.

This object is achieved by a method in accordance with the invention, in that the surfaces to be bonded are each provided with a layer of at least one transition element of the first and/or second transition series of the periodic system of elements (PSE), which layer has a surface roughness in the /μm-range, and in that to form the adhesive bond such a quantity of an electrically non-conductive adhesive is used that the raised portions of the transition-element-layers are still in contact with each other.

DETAILED DESCRIPTION OF THE INVENTION

The following elements belong to the transition elements of the first transition series of the periodic system of elements (PSE): titanium, vanadium, chromium, manganese, iron, cobalt, nickel and copper; the following elements belong to the second transition series of the PSE: zirconium, niobium, molybdenum, technetium, ruthenium, rhodium, palladium and silver. These elements may be used separately or in combination with one another to form the transition-element-layer such that each time two components which are coated with layers of the same or different transition elements can be bonded to each other.

In accordance with an efficacious embodiment of the method in accordance with the invention, an adhesive lacquer, in particular on the basis of cyanoacrylate, epoxy resin or polyester, is used as a bonding agent. All liquid bonding agents which contain organic solvents may form part of the adhesive lacquers. These adhesive lacquers may contain various solutions of thermoplastic synthetic resins, and may also be pressure-sensitive adhesives on the basis of polyisobutylene and polyvinylether, and contact adhesives, which mostly contain dissolved synthetic elastomers. Other examples of the useful adhesive lacquers are mixed adhesive lacquers which predominantly contain oligomers such as two-part adhesives in which a binder and an accelerator are not mixed until before the bonding process (for example, polymethacrylates, polyurethane and epoxy resin precursors, polyethylene imines, unsaturated polyester), or such as one-part adhesives which are made to cross-link and set under the influence of air humidity (cyanoacrylates and iscyanate bonding agents).

In accordance with a further efficacious embodiment of the inventive method, a hot-melt adhesive may also be used as a bonding agent. Solid thermoplastic synthetic resins in the form of thin foils belong to this group of bonding agents. Theoretically, all bonding agents which are suitable for bonding metals can be used, provided that they have a low viscosity or can obtain a low viscosity for example by heating such that raised portions of the rough surfaces to be bonded can still contact each other.

In accordance with an efficacious further embodiment of the invention, the transition-element-layer is provided by electrodeposition. This has the advantage that conventional process steps, as employed in, for example, the industrial-scale manufacture of printed circuit boards, can be used. Consequently, such a coating method is very economical.

In accordance with a further efficacious embodiment of the inventive method, the transition-element-layer can also be produced by a cathode evaporation process. In this way, components can efficaciously be provided with a transition-element layer.

Further, metal-alloy intermediate layers which are manufactured by cathode evaporation or, for example, by vacuum deposition followed by, for example, an ion-etching roughening process, and which layers act as adhesive layers on the substrate, may be reinforced by electrodepositing a transition element-layer.

The desired surface roughness may be imparted to the surfaces to be bonded, either before, during or after the transition-element layer is applied. Before and after the application of this layer, the desired surface roughness can be obtained by an ion-etching process. When these layers are applied by electrodeposition or by cathode evaporation, the resulting surface roughness is sufficient to obtain electrically and mechanically satisfactory bonds. The attainment of the desired surface roughness depends, among others, on the transition elements used to manufacture the transition-element-layer, the composition of the surface of the substrate to be coated, and the processes used to apply the transition-element-layer. It is up to those skilled in the art to decide whether additional methods should be taken to arrive at the desired surface roughness, whether or not, for example, an already deposited transition-element-layer should be roughened, for example, by a subsequent ion-etching process.

The advantages of the present invention are, in particular, that for the manufacture of electrically conductive adhesive bonds metal-powder filled bonding agents, whose disadvantages have already been described, can be dispensed with.

A further advantage is that the use of an electrically non-conductive bonding agent enables also structured surfaces to be bonded, without the corresponding structure having to be formed on the bonding agent, i.e. an electrically non-conductive bonding agent can be evenly distributed over a structured surface without changing the electric properties of the structure; this is impossible with an electrically conductive bonding agent.

A further advantage is that the transition resistance of adhesive bonds formed in accordance with the present method is small when these bonds are simultaneously subjected to a mechanical and a thermal load; this resistance being in the range from 3–9 m $\Omega/mm^2$ of contact surface. It has been found that the transition resistance does not increase until there is a fracture in the adhesive bond.

Following is a description given of exemplary embodiments of the invention.

Example 1

A 0.5 /μm thick gold layer is provided on a silicon substrate, this layer being provided on a 100 nm thick adhesive layer of NiCr and having a surface roughness <100 nm, is provided with an $\simeq$ 5 /μm thick nickel layer by electrodeposition. For this purpose, the substrate which was provided with the nickel-chromium/-gold layers, successively, was first degreased and rinsed in water, and subsequently etched in a 10% $H_2SO_4$ solution and again rinsed in water. Next, the nickel layer is applied by electrolysis in a bath of the following composition. For the manufacture of 0.1 $m^3$ of electrolyte, a 20 kg of $NiSo_4.7\ H_2O$ and 4 kg of $NiCl_2.6\ H_2O$ are dissolved in 0.06 $m^3$ of deionised water having a temperature of 90° C., and the solution is cooled to a temperature of approximately 40° C. Subsequently, 3 kg of $H_3BO_3$ are added and the solution is replenished with deionised water to 0.1 $m^3$. This solution is then mixed with 100 g of activated carbon. After it has settled, the solution is filtered and again replenished to 0.1 $m^3$. By means of $NH_4OH$ the pH-value of the solution is brought to 5. The electro deposition of an $\simeq$ 5 /μm thick nickel layer is then carried out for 20 minutes at a current density of 2 A/$dm^2$ and an electrolyte temperature of approximately 45° C.

Thin, 2 mm wide strips of different bonding agents, such as a cyanoacrylate or a two-part adhesive on the basis of an epoxy resin, were thinly brushed into the layer obtained having a surface roughness of $\simeq$1 /μm, after which said layer was bonded to a second substrate which had also been provided with a nickel layer. The strength of the adhesive bond was tested by a shear tension test with the following parameters: The system was subjected to a shear tension load of up to 1 N/$mm^2$ at elevated temperatures.

The electric conductivity of the adhesive bond was measured in accordance with the Kelvin method with a current of 0.1 A.

Under these conditions, and using the cyanoacrylate bonding agent the adhesive bond did not break under a load of 1 N/$mm^2$ at a temperature of from 150 to 180° C. until after 2 hours; when a cured two-part adhesive on the basis of epoxy resin was used, the adhesive bond lasted several hours at a temperature >250° C. The transition resistance of the adhesive bond varies in time between 3 and 9 m $\Omega/mm^2$.

Example 2

A 1.5 /μm thick copper layer is deposited on a silicon substrate by cathode evaporation.

Before the deposition process, the substrate to be coated is purified in an ion-etching process in a noble gas atmosphere (preferably an argon atmosphere) having a pressure of $\simeq 10^{-5}$ bar for $\simeq$ 1 minute.

The target body is attached to the target electrode for example, by means of a suitable oil. In order to remove dissipated heat it is efficacious to use, for example, water-cooled target electrodes.

The coating process is carried out so that the nebulizer is first evacuated by means of a vacuum pump up to a pressure of $<10^{-8}$ bar, subsequently, a noble gas, preferably argon, having a pressure of $5.10^{-5}$ is introduced into the nebulizer. The deposition rate is approximately 1 nm/s. The substrate temperature is >250° C. The HF energy necessary to form the plasma is fed through the target electrode, a direct voltage of 1000 V being used between the target electrode and the substrate electrode.

After the deposition process, copper layers having a surface roughness of about 0.1 /μm were obtained.

Thus coated substrates were bonded as described in example 1, and the strength of the adhesive bonds was tested in the same way as described in example 1. The test results were comparable to those obtained in example 1.

Example 3

A palladium layer having a thickness in the range from $\simeq$ 2 to 5 /μm was deposited on a silicon substrate by cathode evaporation.

It is efficacious to purify the substrate prior to the deposition process; said purification is carried out by means of an ion-etching process in a noble gas atmosphere (preferably argon atmosphere) having a pressure of $\simeq 10^{-5}$ bar for $\simeq$ 1 minute.

The palladium target body is attached to the target electrode, for example, by means of a suitable oil. In order to remove dissipated heat it is efficient to use, for example, water-cooled target electrodes.

The coating process is carried out so that the nebulizer is first evacuated by means of a vacuum pump up to a pressure of $<10^{-8}$ bar, after which a noble gas, preferably argon, having a pressure of $\simeq 3.10^{-5}$ bar is introduced into the nebulizer. The deposition rate is approximately 1 nm/s. The substrate temperature ranges from 150 to 200° C. The HF energy necessary to form the plasma is fed through the target electrode, a direct voltage of 1000 V being used between the target electrode and the substrate electrode.

After the deposition process, palladium layers having relatively smooth surfaces were obtained, which surfaces were subjected to an ion-etching process to obtain a surface roughness of 1 /μm. For this purpose, the substrate which is provided with the palladium layer is attached to the target electrode of a MF cathode evaporation device and subjected to an ion bombardment by a noble gas plasma having a pressure of $13,10^{-6}$ bar at a power density of 100 W/dm$^2$ for 20 minutes.

Thus coated substrates were bonded as described in example 1, and the strength of the adhesive bonds was also tested in the manner as described in example 1. The test results obtained were comparable to those described in example 1.

What is claimed is:

1. A method of manufacturing an electrically conductive adhesive bond between two electrically conductive parts, said method comprising applying a layer of at least one transition element selected from the group consisting of the first and second series of elements of the periodic system of the elements to a surface present on each of said electrically conductive parts in a thickness such that the resultant coated surfaces have a roughness in the μm range, applying an electrically non-conductive adhesive to at least one of said coated surfaces, bringing coated surfaces, including an adhesive coated surface, of said two electrically conductive parts in contact, one against the other, in a manner such that raised portions of one of said coated surfaces is in contact with raised portions of the other coated surface and adhesively bonding together said coated surfaces.

2. A method as claimed in claim 1, characterized in that an adhesive lacquer is used as the adhesive.

3. A method as claimed in claim 2, characterized in that the adhesive lacquer comprises a cyanoacrylate.

4. A method as claimed in claim 2, characterized in that the adhesive lacquer comprises an epoxy resin.

5. A method as claimed in claim 2, characterized in that the adhesive lacquer comprises an polyester.

6. A method as claimed in claim 1, characterized in that a hot-melt adhesive is used as the adhesive.

7. The method of claim 1 wherein the transition element layer formed of at least one element selected from the group consisting of titanium, vanadium, chromium, manganese, iron, cobalt, nickel and copper.

8. The method of claim 1 wherein the transition element layer is formed of at least one element selected from the group consisting of zirconium, niobium, molybdenum, technetium, ruthenium, rhodium, palladium and silver.

9. The method of claim 1 wherein the desired degree of roughness is imparted to the surfaces to be adhesively bonded prior to the application of the transition element layer.

10. The method of claim 1 wherein the desired degree of roughness is imparted to the surfaces to be adhesively bonded by application of the transition element layer.

11. A method of manufacturing an electrically conductive adhesive bond between two electrically conductive parts, said method comprising applying a layer of at least one transition element selected from the group consisting of the first and second series of elements of the periodic system of the elements to a surface present on each of said electrically conductive parts in a thickness such that, with subsequent processing, the resultant coated surfaces have a roughness in the μm range, applying an electrically non-conductive adhesive to at least one of said coated surfaces, bringing coated surfaces, including an adhesive coated surface, of said two electrically conductive parts in contact, one against the other, in a manner such that raised portions of one of said coated surfaces is in contact with raised portions of the other coated surface and adhesively bonding together said coated surfaces.

12. A method as claimed in claim 11, characterized in that the desired surface roughness is imparted to the surfaces to be bonded by means of an ion-etching process.

13. A method of manufacturing an electrically conductive adhesive bond between two electrically conductive parts, said method comprising applying, by means of an electrodeposition process, a layer of at least one transition element selected from the group consisting of the first and second series of elements of the periodic system of the elements to a surface present on each of said electrically conductive parts in a thickness such that the resultant coated surfaces have a roughness in the μm range, applying an electrically non-conductive adhesive to at least one of said coated surfaces, bringing coated surfaces, including an adhesive coated surface, of said two electrically conductive parts in contact, one against the other, in a manner such that raised portions of one of said coated surfaces is in contact with raised portions of the other coated surface and adhesively bonding together said coated surfaces.

14. A method of manufacturing an electrically conductive adhesive bond between two electrically conductive parts, said method comprising applying, by means of cathode evaporation, a layer of at least one transition element selected from the group consisting of the first and second series of elements of the periodic system of the elements to a surface present on each of said electrically conductive parts in a thickness such that the resultant coated surfaces have a roughness in the μm range, applying an electrically non-conductive adhesive to at least one of said coated surfaces, bringing coated surfaces, including an adhesive coated surface, of said two electrically conductive parts in contact, one against the other, in a manner such that raised portions of one of said coated surfaces is in contact with raised portions of the other coated surface and adhesively bonding together said coated surfaces.

15. A method of manufacturing an electrically conductive adhesive bond between two electrically conductive parts, said method comprising applying a layer of at least one transition element selected from the group consisting of the first and second series of elements of the periodic system of the elements to a surface present on each of said electrically conductive parts in a thickness such that the resultant coated surfaces have a roughness in the μm range, which roughness is imparted to said surfaces prior to the application of said transition element layer by means of an ion etching process, applying an electrically non-conductive adhesive to at least one of said coated surfaces, bringing coated surfaces, including an adhesive coated surface, of said two electrically conductive parts in contact, one against the other, in a manner such that raised portions of one of said coated surfaces is in contact with raised portions of the other coated surface and adhesively bonding together said coated surfaces.

* * * * *